US007816960B2

(12) United States Patent
Saint-Laurent et al.

(10) Patent No.: US 7,816,960 B2
(45) Date of Patent: Oct. 19, 2010

(54) CIRCUIT DEVICE AND METHOD OF MEASURING CLOCK JITTER

(75) Inventors: Martin Saint-Laurent, Austin, TX (US); Boris Dimitrov Andreev, San Diego, CA (US); Paul Bassett, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 172 days.

(21) Appl. No.: 11/836,220

(22) Filed: Aug. 9, 2007

(65) Prior Publication Data

US 2009/0039867 A1    Feb. 12, 2009

(51) Int. Cl.
*H03L 7/06* (2006.01)

(52) U.S. Cl. ........................... 327/158; 327/153

(58) Field of Classification Search ......... 327/147–150, 327/156–159
See application file for complete search history.

(56) References Cited

U.S. PATENT DOCUMENTS

| 4,637,018 | A  | * | 1/1987  | Flora et al. ............... 714/700 |
| 5,805,003 | A  | * | 9/1998  | Hsu .......................... 327/270 |
| 5,818,890 | A  | * | 10/1998 | Ford et al. ................ 375/371 |
| 5,994,938 | A  | * | 11/1999 | Lesmeister ................ 327/277 |
| 6,026,050 | A  | * | 2/2000  | Baker et al. ............ 365/233.1 |
| 6,067,334 | A  | * | 5/2000  | Bostica et al. ............ 375/373 |
| 6,175,605 | B1 | * | 1/2001  | Chi ........................... 375/371 |
| 6,182,236 | B1 | * | 1/2001  | Culley et al. ............. 713/503 |
| 6,229,364 | B1 | * | 5/2001  | Dortu et al. ............... 327/158 |
| 6,232,812 | B1 | * | 5/2001  | Lee ........................... 327/277 |
| 6,256,342 | B1 | * | 7/2001  | Schlag et al. ............. 375/229 |
| 6,373,308 | B1 | * | 4/2002  | Nguyen ..................... 327/161 |
| 6,501,312 | B1 | * | 12/2002 | Nguyen ..................... 327/161 |
| 6,580,304 | B1 | * | 6/2003  | Rieven ....................... 327/276 |
| 6,650,160 | B2 | * | 11/2003 | Tanahashi ................. 327/277 |
| 6,687,321 | B1 | * | 2/2004  | Kada et al. ................ 375/376 |
| 6,720,810 | B1 | * | 4/2004  | New ........................... 327/158 |
| 6,741,660 | B1 | * | 5/2004  | Sattler et al. ............. 375/295 |
| 6,847,241 | B1 | * | 1/2005  | Nguyen et al. ........... 327/158 |
| 7,005,898 | B2 | * | 2/2006  | Tam et al. ................. 327/115 |
| 7,042,971 | B1 | * | 5/2006  | Flanagan et al. ......... 375/376 |
| 7,072,433 | B2 | * | 7/2006  | Bell ........................... 375/376 |
| 7,109,766 | B2 | * | 9/2006  | White et al. .............. 327/158 |
| 7,154,322 | B2 | * | 12/2006 | Kim ........................... 327/276 |
| 7,339,407 | B2 | * | 3/2008  | Jakobs et al. ............. 327/158 |
| 2003/0152181 | A1 | * | 8/2003 | Stengel et al. ............ 375/371 |
| 2006/0197566 | A1 | * | 9/2006 | Jakobs et al. ............. 327/158 |

OTHER PUBLICATIONS

Koichi Nose, Mikihiro Kajita and Masayuki Mizuno; A 1-ps Resolution Jitter-Measurement Macro Using Interpolated Jitter Oversampling; IEEE Journal of Solid-State Circuits; Dec. 2006; pp. 2911-2920; vol. 41, No. 12.

Phillip J. Restle, Robert L. Franch, Norman K. James, William V. Huott, Timothy M. Skergan, Steven C. Wilson, Nicole S. Schwartz and Joachim G. Clabes; Timing Uncertainty Measurements on the Power5 Microprocessor; IEEE International Solid-State Circuits Conference; 2004; Session 19.7.

(Continued)

*Primary Examiner*—Lincoln Donovan
*Assistant Examiner*—Thomas J Hiltunen
(74) *Attorney, Agent, or Firm*—Peter M. Kamarchik; Nicholas J. Pauley; Sam Talpalatsky

(57) ABSTRACT

In an embodiment, a method is disclosed that includes receiving a clock signal at a delay chain of a circuit device and determining a value of the clock signal at a selected point within the delay chain. The method also includes adjusting the selected point when the value does not indicate detection of an edge of the clock signal.

34 Claims, 7 Drawing Sheets

OTHER PUBLICATIONS

Makoto Takamiya, Hiroki Inohara and Masayuki Mizuno; On-Chip Jitter-Spectrum-Analyzer for High-Speed Digital Designs; IEEE International Solid-State Circuits Conference; 2004; Session 19.5.

Jang Seong-Jin, et al., "Virtual fine delay line using one-stage inverter delay," Electronics Letters, IEEE Stevenage, GB, vol. 39, No. 2, Jan. 23, 2003, pp. 189-190.

Matano, T., et al., "A 1-GB/S/PIN 512-MB DDRII SDRAM using a digital DLL and a slew-rate-controlled output buffer," IEEE Journal of Solid-State Circuits, vol. 38, No. 5, May 1, 2003, pp. 762-768.

Rong-Jyi Yang, et al., "A 40-550MHz Harmonic-Free All-Digital Delay-Locked Loop Using a Variable SAR Algorithm," IEEE Journal of Solid-State Circuits, vol. 42, No. 2, Feb. 1, 2007 pp. 361-373.

European Search Report—EP08005117, Search Authority—Munich, Oct. 21, 2008.

European Written Opinion—EP08005117, Search Authority—Munich, Oct. 21, 2008.

International Search Report—PCT/US08/072629—International Search Authority, European Patent Office—Nov. 7, 2008.

Written Opinion—PCT/US08/072629—International Search Authority, European Patent Office—Nov. 7, 2008.

* cited by examiner

CIRCUIT DEVICE AND METHOD OF MEASURING CLOCK JITTER

BACKGROUND

I. Field

The present disclosure is generally related to circuit devices and methods of measuring clock jitter.

II. Description of Related Art

In general, the temporal stability of a clock signal within a circuit device can impact performance, particularly within synchronous digital circuit devices. Short-term clock fluctuations, or clock jitter, can degrade system performance due to a hazard of timing constraint violations. Clock jitter introduces a parametric yield limitation in circuit devices, because the clock jitter affects the maximum frequency at which core processors can operate. Conventionally, a reduction in the processor frequency can be difficult to measure accurately, in part, because insertion of measurement points may also perturb the clock signal. For example, external test probes measuring clock jitter may perturb the clock signal by introducing capacitances, inductances, impedance mismatches, and other anomalies that can introduce additional clock fluctuations.

To measure clock jitter more accurately, on-chip test structures have been added to circuit devices. On-chip test structures can include a large number of flip-flops to capture a clock value at multiple sampling points along a delay chain. However, to accurately sample the clock signal, a large number of sampling points and therefore a large number of flip-flops are used. The large number of flip-flops can occupy significant area of the overall circuit. Further, accuracy associated with such test structures is typically limited to the insertion delay of each element of the delay chain. For example, if each element in the delay chain has a 20-picosecond delay, the accuracy of the measurement taken between elements in the delay chain may be limited to plus or minus 20 picoseconds. In processor circuits that operate at frequencies in excess of a one Gigahertz, a 40-picosecond delay margin can represent a significant amount of uncertainty in the detected clock jitter, which may be addressed by adding an operating margin that is greater than the detected clock jitter uncertainty margin. This operating margin limits the frequency at which the circuit device can operate.

Further, once clock jitter in a particular circuit design is measured, it remains difficult to determine whether a design change may reduce jitter. While an excessive jitter margin may increase area usage of a circuit substrate, increase power consumption, and increase a time to market for a particular design, an insufficient jitter margin may result in reduced quality and increased number of failures or reduced yield. Hence, there is a need for improved circuit devices and methods of measuring clock jitter.

SUMMARY

In a particular embodiment, a method is disclosed that includes sending a clock signal along a delay chain of a circuit device and determining a value of the clock signal at a selected point within the delay chain. The method also includes adjusting the location of the selected point when the value does not indicate detection of a desired portion of the clock signal.

In another particular embodiment, a circuit device is disclosed that includes a delay chain composed of multiple delay elements. The delay chain is responsive to a clock signal. The circuit device also includes a logic circuit and a hierarchical multiplexer circuit with multiple inputs responsive to the delay chain. The logic circuit controls the hierarchical multiplexer to determine a value of the clock signal at a selected point within the delay chain and to adjust the selected point when the value does not indicate an edge of the clock signal.

In still another particular embodiment, a method is disclosed that includes receiving a clock signal at a delay chain of a circuit device and determining a location of an edge of the clock signal within the delay chain to determine a clock period. Locating the edge of the clock signal includes iteratively determining a value of the clock signal at a selected point within the delay chain and adjusting the selected point until the value indicates an edge of the clock signal. The method also includes comparing the location of the edge of the clock signal with a location of an edge of a nominal clock signal to determine a clock jitter measurement.

In yet another particular embodiment, a processor device is disclosed that includes means for passing a clock signal along a delay chain of a circuit device and means for determining a value of the clock signal at a selected point. The processor device also includes means for adjusting the selected point when the value does not indicate an edge of the clock signal.

One particular advantage provided by embodiments of the clock jitter determination circuit is provided in that the clock jitter determination circuit achieves high accuracy in determining clock jitter, allowing designers to set a smaller clock jitter margin to enhance operating clock speeds for circuit devices.

Another particular advantage is provided in that the clock jitter determination circuit occupies a smaller area of the overall circuit and consumes less operating power than jitter compensation circuits and/or conventional clock jitter determination circuits.

Yet another particular advantage is provided in that the clock jitter determination circuit is adapted to measure jitter over long periods of time on processor cores that are executing various applications.

Another particular advantage is provided in that the clock jitter determination circuit can operate without calibration.

Another advantage is realized in that the clock jitter determination circuit does not require analog circuit components.

Other aspects, advantages, and features of the present disclosure will become apparent after review of the entire application, including the following sections: Brief Description of the Drawings, Detailed Description, and the Claims.

DETAILED DESCRIPTION

Figure 1:
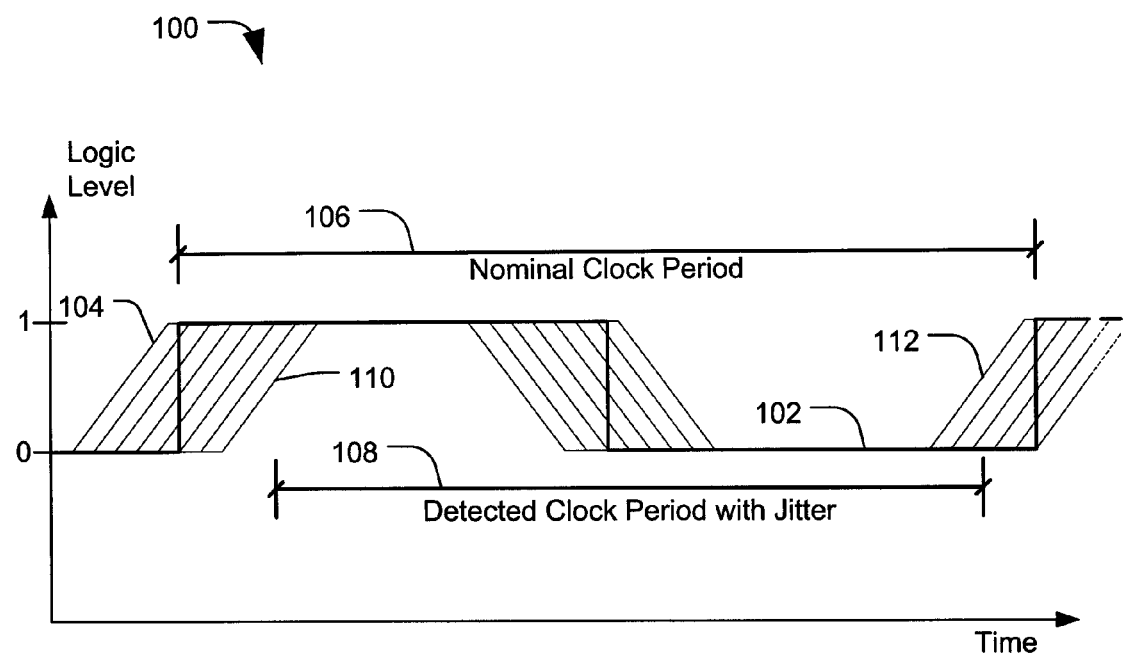
FIG. 1 is a graph illustrating a clock signal that includes timing uncertainty due to jitter.

FIG. 1 is a graph 100 illustrating a clock signal 102 that includes timing uncertainty due to jitter. The graph 100 includes an x-axis representing time and a y-axis representing a logic level or voltage level. It should be understood that the time axis may indicate time in units of circuit delay, units of absolute time (such as nanoseconds), other units, or any combination thereof. The clock signal 102 has a nominal clock period 106 and has a detected clock period with jitter 108. In general, clock jitter is a distortion in clock cycle and phase difference accumulated over time, such that the clock edge (rising edge, falling edge or both) may be distorted, or may arrive early or late relative to an expected nominal clock edge. Early rising clock edges caused by jitter are generally indicated by reference numerals 104 and 112 and a delayed clock edge is generally indicated by reference numeral 110.

In general, the clock signal 102 may include multiple potential transitions from a logical low level to a logical high level, as generally indicated by the line 104 and the line 110. The clock signal 102 also includes a transition from a logical high level to a logical low level. In addition, a subsequent transition from the logical low level to the logical high level is shown at 112. While the clock signal 102 may have a nominal clock period 106, the actual clock period may vary depending on the various potential edge transitions and delays associated with such transitions (i.e., based on the jitter). In this instance, the detected clock period with jitter 108 represents a worst case clock jitter where the detected clock period is shorter than the nominal clock period, which, in conventional systems, could result in data transition errors due to clock jitter, unless the designer had built in an operating clock margin to account for such clock jitter.

In general, the jitter described with respect to FIG. 1 is related to a difference between an expected nominal clock period (from a rising edge of a first nominal clock pulse to a rising edge of a next nominal clock pulse) and a determined clock period (from a rising edge of a received clock pulse to a rising edge of a next received clock pulse). However, it should be understood that a clock jitter value can also be determined from falling edges of the clock signal or from selected portions of the clock signal.

Figure 2:
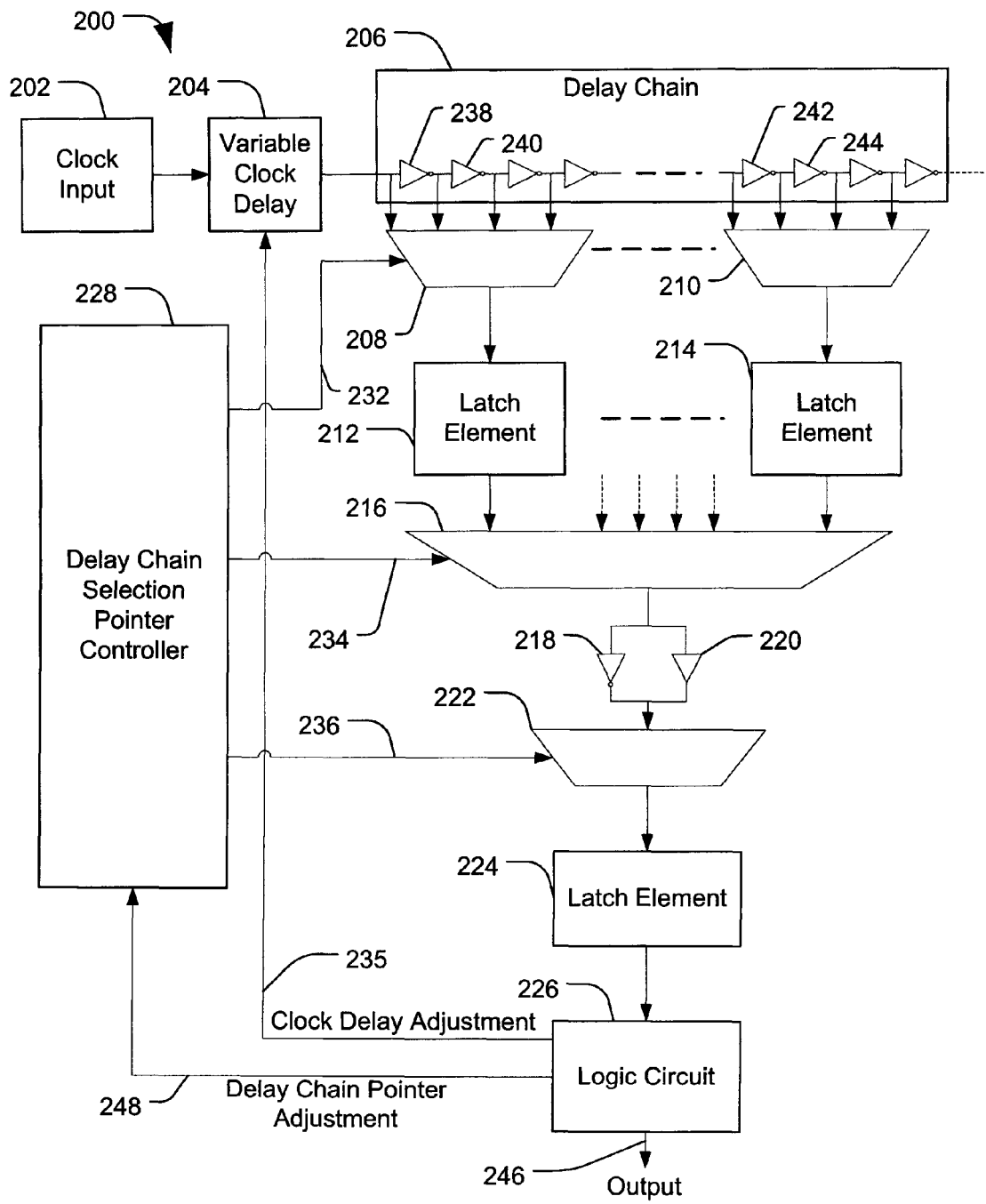
FIG. 2 is a block diagram of a particular illustrative embodiment of a circuit to measure clock jitter.

Referring to FIG. 2, a block diagram of a particular illustrative embodiment of a circuit device 200 that may be used to measure clock jitter, by determining a clock period and by comparing the clock period to an expected nominal clock period. The circuit device 200 includes a clock input 202, a variable delay element 204, and a delay chain 206. The delay chain 206 includes a plurality of delay elements, which can be buffers, inverters, other delay elements, or any combination thereof. In a particular embodiment, the delay chain 206 can include a plurality of serially connected inverters including the illustrated inverters 238, 240, 242, and 244. The clock input 202 is responsive to a source to receive a clock signal, which is provided to the delay chain 206 after compensation via the variable delay element 204. In general, the series delay introduced by each of the plurality of series connected inverters of the delay chain is much smaller than a nominal clock period (i.e., an expected clock period). In a particular illustrative, non-limiting embodiment, the nominal clock period may be 1,000 picoseconds and each inverter can represent approximately a 20-picosecond delay.

The circuit device 200 also includes a hierarchical multiplexer circuit, which includes a first tier of one or more multiplexer circuits, such as multiplexers 208 and 210. The hierarchical multiplexer circuit also includes a second tier multiplexer circuit 216, which can be used to determine clock jitter by sampling a clock signal within the delay chain 206. Additionally, the hierarchical multiplexer circuit may include logic circuit devices, such as one or more latch elements 212 and 214. In a particular illustrative embodiment, the hierarchical multiplexer circuit can include additional tiers of multiplexer circuits or logic, such as the multiplexer 222 and latch element 224.

The circuit device 200 also includes a delay chain selection pointer controller 228, which controls the hierarchical multiplexers. In particular, the delay chain selection pointer controller 228 controls the multiplexers 208 and 210 via a control line 232, controls the multiplexer 216 via a control line 234, and controls the multiplexer 222 via a control line 236. The circuit device 200 further includes a logic circuit 226 that is responsive to the latch element 224 and that is adapted to determine an edge of a clock signal at a point within the delay chain 206.

The logic circuit 226 can provide data related to the clock signal at the output 246. In a particular illustrative embodiment, the logic circuit 226 may provide a value or other indicator at the output 246 that can be used by software or other circuitry to identify a clock period of the received clock signal at the delay chain 206. In a particular illustrative embodiment, the logic circuit 226 provides a delay chain pointer adjustment 248 (feedback control signal) to the delay chain selection pointer controller 228. Additionally, the logic circuit 226 provides a clock delay adjustment feedback signal 235 to the variable clock delay element 204.

The first tier of multiplexers, such as the multiplexers 208 and 210, include multiple inputs coupled to different points in the delay chain 206 and are controlled by the delay chain selection pointer controller 228 to multiplex values from respective points in the delay chain 206. For example, the multiplexer 208 may be controlled by the delay chain selection pointer controller 228 via the control line 232 to multiplex (sample) the value of a clock signal at a point between delay elements 238 and 240. The multiplexer 210 can also be controlled by the delay chain selection pointer controller 228 via the control line 232 to sample the value of the clock signal at a point between delay elements 242 and 244 within the delay chain 206. The multiplexer 208 provides the sampled value to the latch element 212 and the multiplexer 210 provides the sampled value to the latch element 214.

In general, each of the serially connected invertors (buffers or other delay elements) of the delay chain 206 performs the function of a delay element and each has a pre-determined nominal delay associated with data passing through the inverter. In a particular illustrative, non-limiting embodiment, the nominal clock period may be 1,000 picoseconds and each inverter can represent approximately a 20-picosecond delay. Using the delay chain 206 to measure clock jitter, the delay represented by each inverter determines a granularity of the measurement (i.e., an error margin for a given sample). For example, in a particular illustrative embodiment, a measurement taken between two delay elements is known to an accuracy of approximately plus or minus 20 picoseconds (i.e., an error margin of approximately 40 picoseconds). The variable clock delay 204 can be controlled by the logic circuit 226 via the clock delay adjustment feedback signal 235 to insert a known time offset to the clock signal at the input of the delay chain 206, such that the resolution of the delay chain 206 can be made more precise for the purposes of determining clock jitter. For example, if the sampling point between the inverters 238 and 240 represents a period of time of 40 picoseconds from the beginning of the delay chain to the sampling point, the variable clock delay 204 can introduce a 5-picosecond delay that adjusts the total insertion delay to the sampling point, such that the period of time for the signal to propagate to the sampling point at the output of the inverter 240 represents 45 picoseconds. Thus, the granularity of the particular clock edge determination can be enhanced to more precisely determine the clock period.

In a particular illustrative embodiment, a clock signal received at the clock input 202 is received at the delay chain 206 of the circuit device 200. The delay chain selection pointer controller 228 controls the first tier of the hierarchical multiplexer, such as the multiplexers 208 and 210, to sample a point within the delay chain 206. In general, the multiplexers 208 and 210 include a plurality of inputs that are responsive to a plurality of outputs of the delay chain 206. Each of the plurality of outputs of the delay chain 206 corresponds to a respective output of one of the delay elements, such as the illustrated invertors.

The clock signal is sampled at a selected point within the delay chain 206. The selected point within the delay chain 206 may represent a clock edge of a clock having a nominal or expected clock period. Alternatively, the selected point may represent an edge for a clock having a clock period that is greater than the nominal or expected clock period. The delay chain selection pointer controller 228 controls the multiplexers 208 and 210 to provide the sampled data to the latch elements 212 and 214. It should be understood that there are a plurality of outputs from the first tier of the hierarchical multiplexer circuit, which provides sampled data from the delay chain 206 to a plurality of logic elements. The sampled data from the plurality of latch elements are provided in parallel to a second tier multiplexer of the hierarchical multiplexer circuit, such as the second multiplexer 216. The data may be provided to another tier of the hierarchical multiplexer circuit represented by an inverter 218 and a buffer 220 coupled in parallel, which provide the sampled clock data to a multiplexer 222. The delay chain selection pointer controller 228 can control the multiplexer 222 via the control line 236 to provide the sampled clock data to a latch element 224 and to the logic circuit 226. The logic circuit 226 is adapted to determine whether the clock edge was found at the sampling point within the delay chain 206.

The logic circuit 226 may provide an output, such as data related to the sampling point in the delay chain 206 via the output 246. Additionally, the logic circuit 226 may provide a delay chain pointer adjustment 248 to the delay chain selection pointer controller 228 to adjust a sampling point of the multiplexers 208 and 210 to sample a different point within the delay chain 206. In a particular illustrative embodiment, the sampling point in the delay chain 206 may indicate a clock period that is smaller than a nominal clock period, and the sampling point may be adjusted by selecting a different sampling point in the delay chain to identify a second point that is earlier in the delay chain than the initial point. The sampling point in the delay chain 206 may represent an expected distance along the delay chain 206 traveled by the edge of the clock signal based on the nominal clock frequency.

In a particular illustrative embodiment, if the logic circuit 226 determines that the clock edge was not found at the sampling point within the delay chain 206, the logic circuit 226 may alter the sampling point to sample at a different point of a clock having a period that is less than or greater than the expected clock period, depending on the value of the sampled data. In particular, if the rising clock edge did not reach the sampling point, the logic circuit may provide a delay chain pointer adjustment 248 to compensate for a shorter clock period. The circuit device 200 can perform the process again, by controlling the multiplexers 208, 210, 216, and 222 of the hierarchical multiplexer circuit to sample at the adjusted sampling point.

Once the logic circuit 226 locates the clock edge within the delay chain 206, the logic circuit 226 may adjust the variable clock delay 204 via the clock delay adjustment feedback signal 235 to adjust the input clock signal by a known time increment, such that the clock signal transitions in the delay chain 206 at an adjusted time (i.e., $T_0+\Delta T$), where $T_0$ represents the propagation/insertion delay from the beginning of the delay chain 206 to the sampling point in the delay chain 206 before the input clock signal is adjusted. The delay chain selection pointer controller 228 can resample the clock signal at the sampling point within the delay chain 206 to more accurately determine the clock edge.

The variable clock delay element 204 is coupled to an input of the delay chain 206 to offset the received clock signal by a known time increment with high precision to alter a time at which clock signal is received at the delay chain 206. By adjusting the variable clock delay 204, the granularity of the delay chain 206 is effectively enhanced or refined. The variable clock delay 204 thereby provides a mechanism for the circuit device 200 to provide small precise clock adjustments during the clock edge detection process. In particular, the input clock signal can be adjusted by an increment that is less than the delay introduced by each delay element of the delay chain 206. For example, if each delay element, such as the inverter 238, introduces a 20-picosecond delay, the variable clock delay element 204 can introduce a 5-picosecond delay (a delay having a known time increment) to determine whether the clock edge is pushed to the next sampling point within the delay chain, reducing a margin of error of the clock edge detection to plus or minus 5 picoseconds, without having to add additional sampling points. While a delay of 5 picoseconds is described, it should be understood that other time increments may also be used.

Thus, the logic circuit 226, by providing the delay chain pointer adjustment 248, can sample different points within the delay chain 206 and may control the delay chain selection pointer controller 228 to provide an iterative adjustment of the hierarchical multiplexers to sample different points along the delay chain. The iteratively adjusted samples of the received clock signal can be used to find the first clock edge signal, so that the edge of the clock signal is detected in order to account for jitter (i.e., fluctuations in the timing of the clock edge).

The logic circuit 226 can optionally refine the edge detection by providing a clock delay adjustment feedback signal 235 to adjust the variable clock delay 204. The logic circuit 226 can use the adjusted clock to determine more precisely the transition of the clock signal. For example, the logic circuit 226 may adjust the variable clock delay 204 by a first fraction of the delay period (i.e., a fraction of a delay introduced by each delay element of the delay chain 206). The logic circuit 226 may then re-sample the adjusted clock to detect the edge of the clock. If the detected edge of the clock signal still has an uncertainty in the measurement that exceeds a threshold uncertainty, the logic circuit may adjust the variable clock delay 204 by a second fraction that is smaller than the first fraction. The logic circuit 226 can iteratively adjust the variable clock delay 204 until an edge of the clock is determined to a desired level of precision.

During a last iteration, the logic circuit 226 can provide an output 246, indicating that the edge of the clock signal was detected to a desired level of precision. In a particular illustrative embodiment, the logic circuit 226 can provide a control signal indicating a shortest detected clock period based on the clock jitter. The shortest detected clock period may indicate a worst case clock period. Additional circuit elements may use such information to perform useful functions such as to adjust a frequency of an operating clock or to adjust a voltage of a circuit. For example, an adaptive voltage and frequency control circuit may be provided that can utilize the detected clock period to adjust a clock frequency or a voltage. Such adjustments to frequency or voltage may be used to provide more accurate timing and may thereby allow a resulting circuit to be tuned for improved performance, power savings, or any combination thereof.

In general, it should be understood that the first tier of multiplexers (e.g., the multiplexers 208 and 210) within the hierarchical multiplexer circuit can be implemented using a plurality of multiplexers having approximately equal numbers of inputs that are coupled to a plurality of different points within the delay chain 206. In a particular illustrative embodiment, by utilizing approximately equal numbers of inputs for each multiplexer of the first tier of multiplexers, a delay through the first tier of multiplexers (i.e., multiplexers 208 and 210) can be balanced. In a particular embodiment, the multiplexers may be eight-to-one multiplexers and sixteen multiplexers may be used to sample 128 points within the delay chain 206. In another particular embodiment, a larger number of multiplexers may be used to sample more points in the delay chain. Additionally, it should be understood that, while only a single second tier multiplexer 216 is shown, the second tier of multiplexers may include one or more multiplexer components. In a particular illustrative embodiment, the hierarchical multiplexer circuit may include multiple tiers of multiplexers.

In general, depending on the particular implementation, the sampling point signal arrival time may be initially selected to be greater than, equal to, or smaller than a nominal clock period. A sampling point within the delay chain 206 may be selected based on the expected sampling point signal arrive time. Based on a received clock signal, other sampling points may be iteratively selected (either earlier or later within the delay chain 206) until a desired portion of the received clock signal is detected at the particular sampling point. In a particular illustrative embodiment, the desired portion of the received clock signal may be a rising edge of the clock signal. In another particular illustrative embodiment, the desired portion of the received clock signal may be a falling edge. In still another particular illustrative embodiment, the desired portion of the clock signal may be a level portion. In this particular instance, multiple sampling points may be used to determine a pulse width of the level portion of the clock signal, for example. In either case, a clock jitter value may be determined based on deviation of the desired portion of the received clock signal from the respective desired portion of a nominal clock signal.

In a particular illustrative embodiment, the circuit device 200 may be used to measure clock jitter in relative units of circuit delay. In a particular illustrative embodiment, a minimum clock period may be determined. In another particular illustrative embodiment, the circuit device 200 may be used to track clock variations in relative units of circuit delay rather than in units of time. However, logic may be utilized to convert a measured circuit delay to time units via a calibration.

Additionally, while the discussion of FIG. 2 indicates a hierarchical arrangement of multiplexers for sampling the clock signal, it should be understood that there are many different circuit configurations that may be used to sample the clock signal. For example, the multiplexers 208 and 210 may be replaced with a single multiplexer having a number of inputs that correspond to the number of sample points within the delay chain 206.

Figure 3:
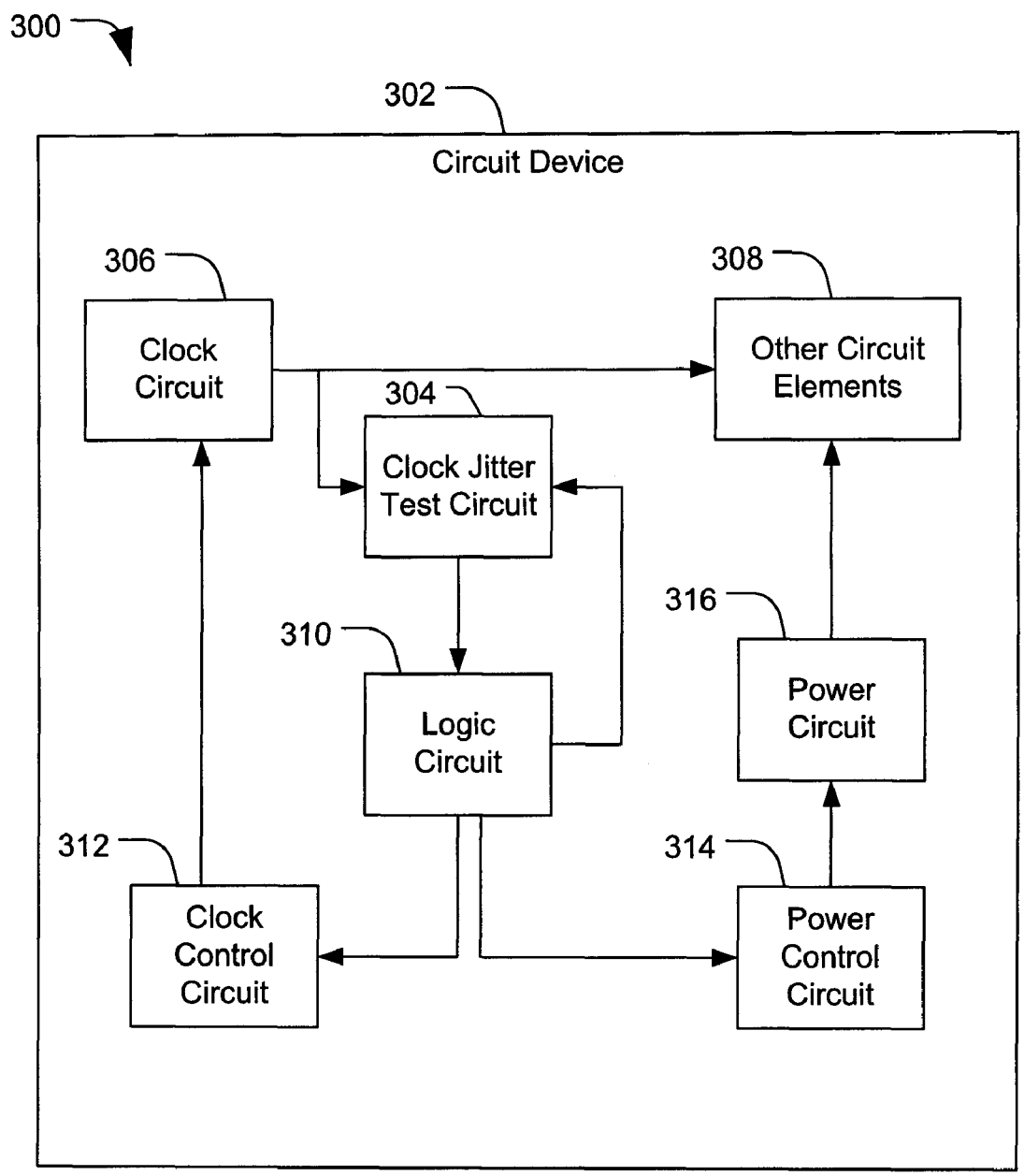
FIG. 3 is a block diagram of a particular illustrative embodiment of a circuit device including a circuit to measure clock jitter.

Referring to FIG. 3, a system 300 is shown that includes a circuit device 302. The circuit device 302 includes a clock circuit 306, a clock control circuit 312, a logic circuit 310, a clock jitter test circuit 304, a power control circuit 314, a power circuit 316 and other circuit elements 308. The clock circuit 306 is responsive to the clock control circuit 312 and can provide an output (such as a clock signal) to the other circuit elements 308. The clock jitter tester circuit 304 may be coupled to the output of the clock circuit 306 to test the clock signal to determine a clock period. The clock jitter tester circuit 304 provides an output to logic circuit 310, which can determine whether the clock period of the clock signal from the clock circuit 306 matches an expected value. When the clock edge is not detected or if the clock edge is not received at an expected time, the logic circuit 310 may adjust a sampling point within the clock jitter test circuit 304 to measure the clock period that includes clock jitter.

Once the logic circuit 310 detects the measured clock period, the logic circuit 310 may adjust the clock control circuit 312 to control the clock circuit 306. The logic circuit 310 may provide a first output to the clock control circuit 312 and a second output to the power control circuit 314. In a particular embodiment, the logic circuit 310 provides an adjustment signal to the clock control circuit 312 to control the clock circuit 306. The logic circuit 310 may also provide information related to a detected clock period after performing the clock jitter test circuit measurement to the power control circuit 314, which can use the detected clock period information from the logic circuit 310 to provide a control signal to the power circuit 316. In a particular illustrative embodiment, the logic circuit 310 may provide information related to the clock period to the power control circuit 314, which may use such information to control the power circuit 316, and an adjusted power or other control signal may be provided to other circuit elements 308 within a system, such as a system-on-a-chip (SOC) device.

In a particular illustrative, non-limiting embodiment, the logic circuit 310 may provide information related to the measured clock period to the power control circuit 314. The power control circuit 314 can use such information, for example, to adjust power to other circuit elements 308. Alternatively, the power control circuit 314 could provide additional power to the clock control circuit 312, to the clock circuit 306, or any combination thereof (connection not shown) to provide additional power to the clock circuit 306 to potentially reduce the clock jitter.

Figure 4:
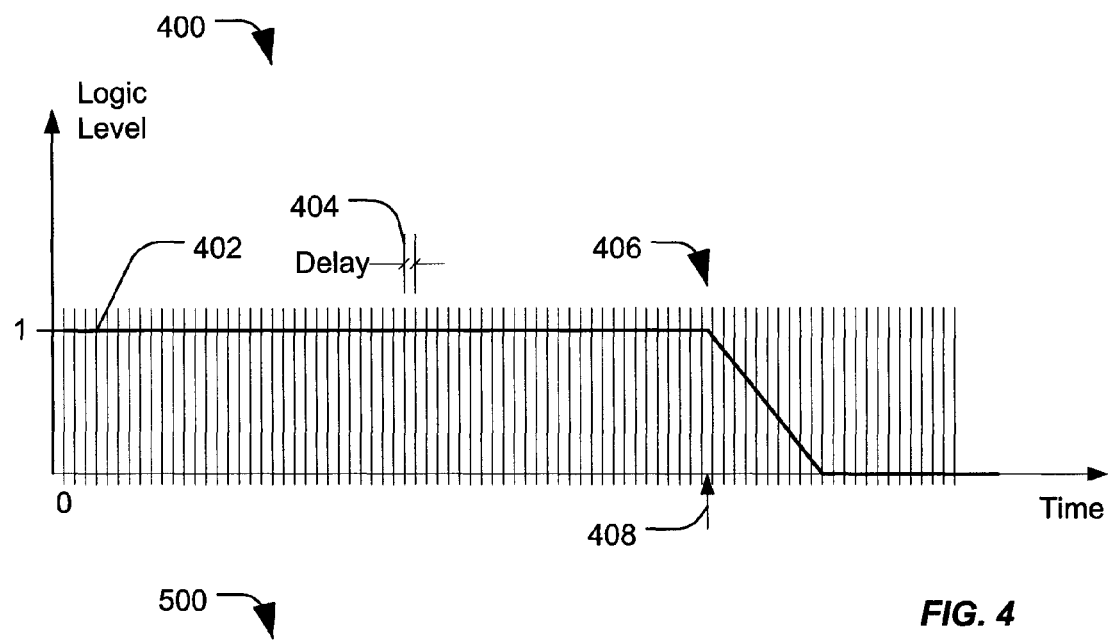
FIG. 4 is a timing diagram illustrating edge detection of a clock signal using the circuits shown in FIGS. 2 and 3.

Referring to FIG. 4, a portion of a representative clock signal 400 is shown. The clock signal 400 is at a logic level high at 402 and transitions to a logic level low beginning at 406. The clock signal 400 is shown on a grid that illustrates a plurality of sampling points taken between delay elements, which represent a delay such as delay 404. The transition point 406 of the clock signal 400 occurs within a window between sampling points as indicated at 408. Since the transition 406 occurs between sampling points, as shown, the precision of the sampled transition point is known within a margin that is defined by the sampling window 408.

Figure 5:
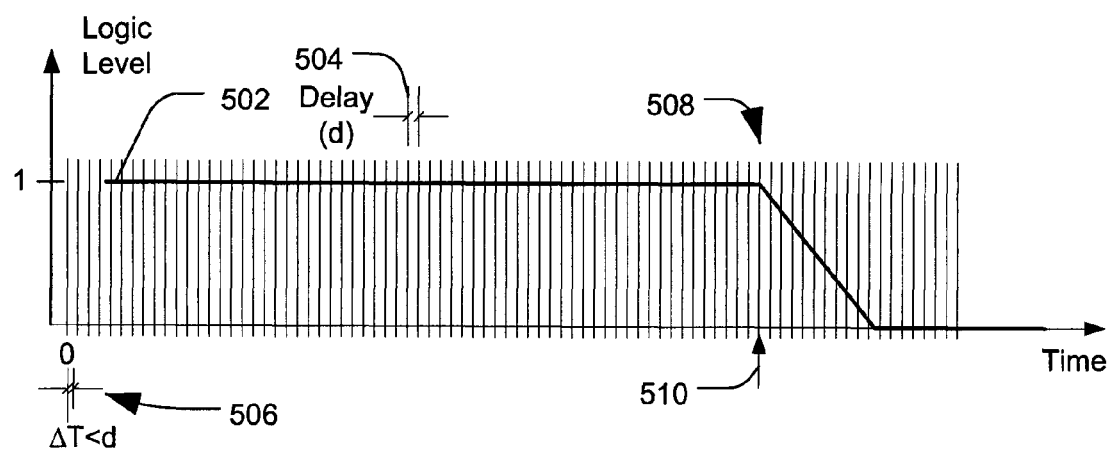
FIG. 5 is a timing diagram illustrating edge detection of a clock signal using the circuits shown in FIGS. 2 and 3 after adjusting the clock signal timing by a known delay.

Referring to FIG. 5, the clock signal may be delayed using a variable delay element, such as the variable clock delay 204 in FIG. 2, to provide a delayed version of the clock signal 500. In particular, the variable delay element may insert a known time offset to the clock signal at the input of the delay chain.

The delayed clock signal 500 may be delayed by a time increment (time offset) that is known precisely. As shown in FIG. 5, the delayed clock signal 500 is a delayed version of the clock signal 400 (in FIG. 4) that has been delayed by a time increment ($\Delta T$) indicated at 506, such that the transition point from the logic level high 502 to the logic level low of the delayed clock signal 500 occurs at a point 508, which corresponds to a sampling point 510. By inserting a precise time offset, the transition of the clock edge point 508 may be determined with a greater degree of accuracy than the delay elements of the delay chain (such as the delay chain 206 in FIG. 2) might otherwise allow.

Figure 6:
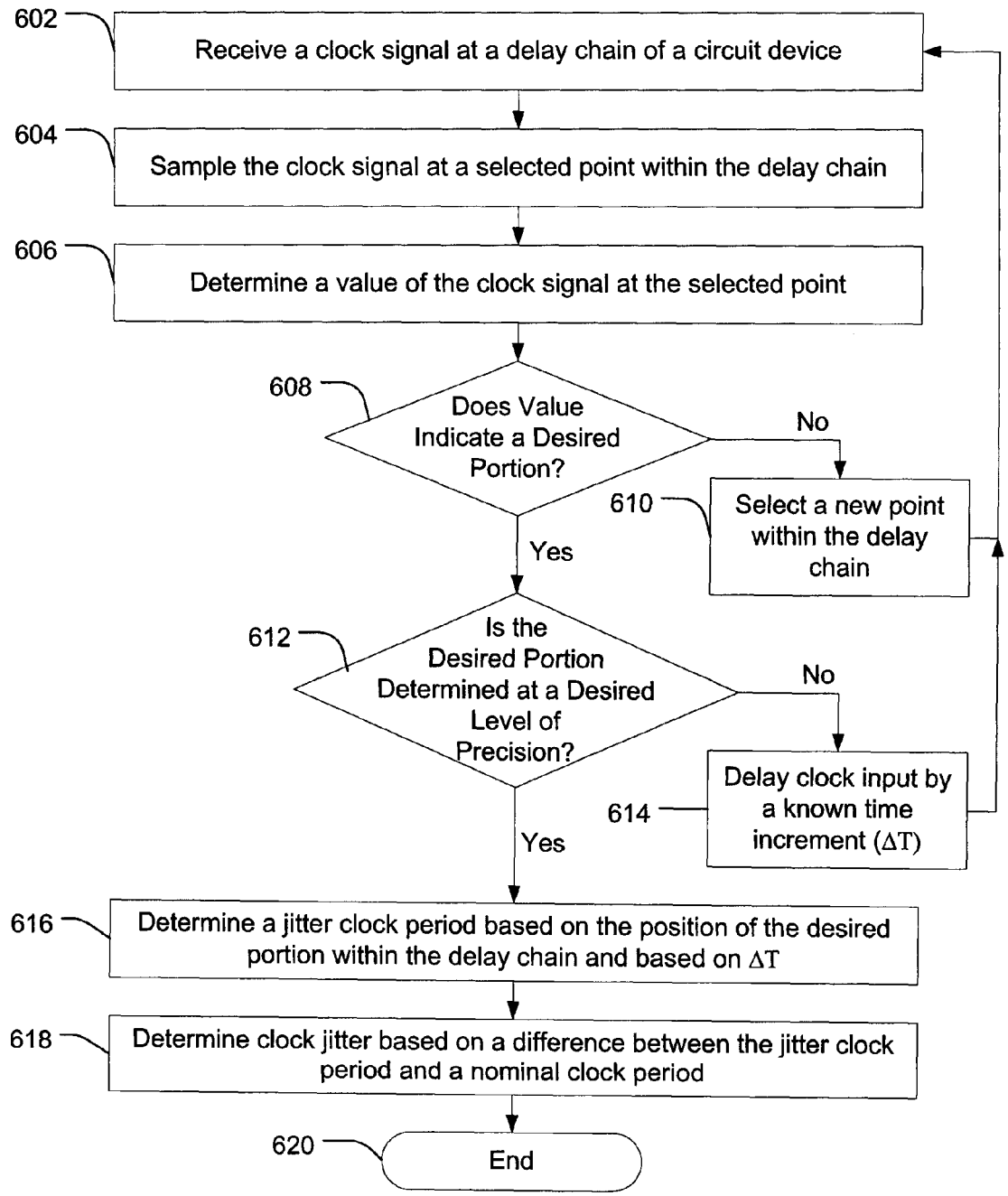
FIG. 6 is a flow diagram of a particular illustrative embodiment of a method of measuring clock jitter.

Referring to FIG. 6, a method of detecting a clock period and determining clock jitter, such as through use of the circuit device in FIG. 2, is illustrated. The method includes receiving a clock signal at a delay chain of a circuit device, as shown at 602. In a particular illustrative embodiment, the circuit device may include a clock generator, which sends the clock signal to the delay chain. The method further includes sampling the clock signal at a selected point within the delay chain, at 604, and determining a value of the clock signal at the selected point, as shown at 606. In a particular illustrative embodiment, the selected point is a sampling point within the delay chain. The sampling point may initially represent a sampling point within the delay chain where a desired portion of an expected nominal clock signal should be detected. The desired portion may be a rising edge, a falling edge, or a level portion of the clock signal. In a particular illustrative embodiment, the blocks indicated at 604 and 606 may be combined. In another particular embodiment, the value of the clock signal at the selected point may be determined by calculating, scaling, interpolating, or otherwise processing the value of the clock signal sampled at 604.

Proceeding to 608, the value of the clock signal at the sampling point is then compared to determine whether the value of the clock signal represents a desired portion (e.g., a rising edge, a falling edge, a level portion). If the value of the clock signal indicates that the desired portion is detected, then the method proceeds to block 612. If the clock value indicates that the desired portion is not detected, then the method proceeds to block 610 where a new sampling point is selected within the delay chain. The method returns to 602 and processing continues. If, initially, the value of the clock signal indicates that a desired portion is not detected, as shown at 610, subsequent processing occurs at different sampling points within the delay chain until the desired portion of the clock signal is finally detected at 608. Then, the method continues to 612.

Once the sampled value indicates that the desired portion has been detected, the sampled value is then compared to a desired level of precision at decision step 612. If the desired level of precision is not accomplished, then the method proceeds to step 614 where the clock input is delayed by a known time increment ($\Delta T$). After the clock input is delayed by the known time increment ($\Delta T$), the method returns to step 602 for further processing.

When the clock edge is determined at a desired level of precision, at 612, the method continues to 616 where a jitter clock period has been determined (i.e., measured) based on the position of clock edge within the delay chain and based on the known time increment ($\Delta T$). In addition, the method proceeds to 618 where the clock jitter is determined based on a difference between the measured jitter clock period and a nominal clock period. The method ends at 620 after the jitter clock period and the difference between the jitter clock period and the nominal clock period have been determined. Thus, the method can provide both a detected jitter clock period and a difference of the detected jitter clock period from a nominal clock period to identify a jitter error measurement.

The clock period is determined based on detection of an edge of the clock signal at a selected point of a delay chain. In addition, the clock period is determined at a specific time (representative of a propagation/insertion delay from the beginning of the delay chain to the sampling point within the delay chain) based on a value determined from a specific point within the delay chain that indicates the edge of the clock signal. Further, an error margin associated with the detection of clock edge is known based on the delays introduced by elements within the delay chain 206, and the error margin may be reduced by shifting a time at which a clock signal is received at the delay chain by a known time increment, such as by use of a high precision variable clock delay element 204 as shown in FIG. 2. In addition, to increase precision, the known time increment of the variable delay element can be a fraction of the delay time of one of the invertors within the delay chain. In addition, after the jitter clock period and a difference between the jitter clock period and a nominal clock period have been determined, the resulting information may be used to control a frequency of an operating clock or may be used to control voltage of the operating clock or of other circuit components.

For the clock jitter determination, the initial sampling point can be a point in a delay chain that represents a propagation/insertion delay that is greater than a nominal clock period, where the nominal clock period is based on an expected frequency of the clock signal. In this example, the adjustment of the selection point includes sampling the clock signal at the selected point in the delay chain, and iteratively adjusting the selected point to until an edge of the clock signal is detected. In a particular illustrative embodiment, a logic circuit initially selects a point in the delay chain that is greater than an expected clock period and, if the clock edge is not detected, the logic selects a second point in the scan chain and determines a value of the clock signal at the second point. If the clock edge is not found, the logic adjusts the sampling point in the scan chain again. Thus, the selected point is a point within the delay chain that is related to an expected distance traveled along the delay chain by the edge of the clock signal based on the nominal clock frequency, and such selected point can be iteratively adjusted to earlier points in time to find the transition edge of the clock signal in order to perform the jitter clock detection.

Figure 7:
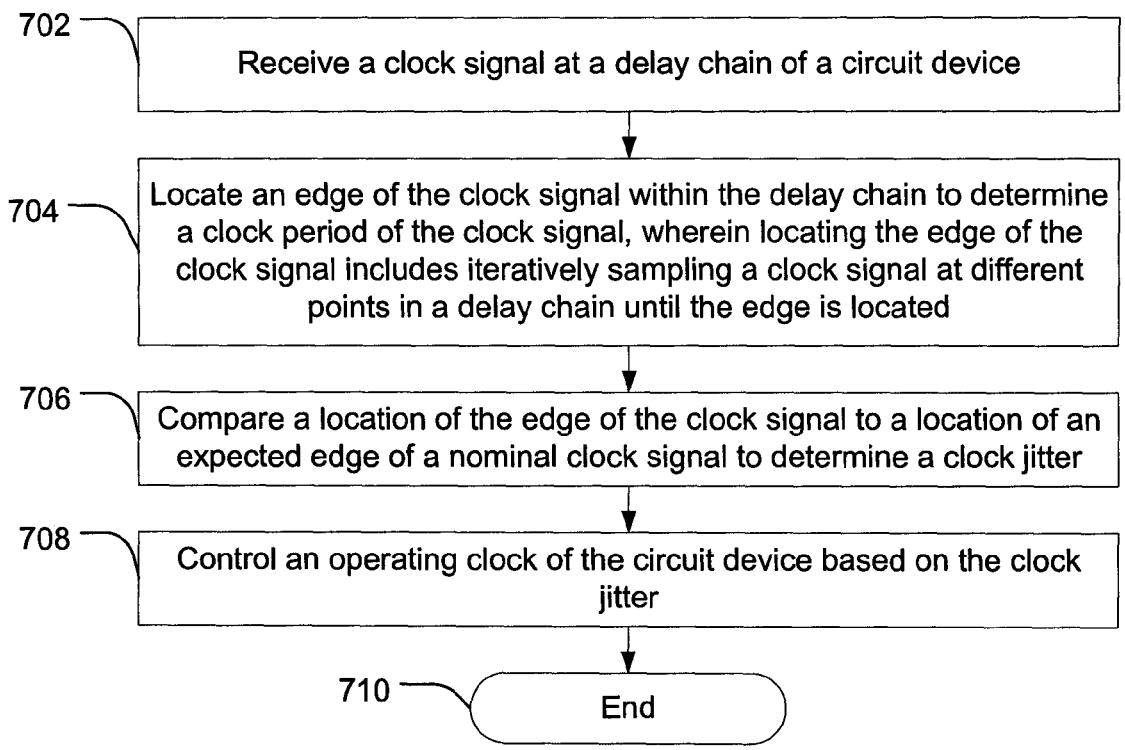
FIG. 7 is a flow diagram of a particular illustrative embodiment of a method of controlling an operating clock of a circuit device based on a measured clock jitter.

Referring to FIG. 7, in another illustrative embodiment, a method of controlling an operating clock of a circuit based on a detected jitter measurement is shown. The method includes receiving a clock signal at a delay chain of a circuit device, at 702, and locating an edge of the clock signal within the delay chain to determine a clock period of the clock signal, at 704. Locating the edge of the clock signal includes sampling a clock signal at different points in the delay chain until the clock edge is located. The method further includes comparing the location of the edge of the clock signal to a location of an expected edge of a nominal clock signal to determine a clock jitter value, at 706, and controlling an operating clock or an operating voltage of the circuit device based on the clock jitter value, at 708. The method terminates at 710.

In a particular illustrative embodiment, the selected point for purposes of the measurement is a point within the delay chain that is greater than the sampling point associated with a nominal clock period. Once the clock period accommodating for the jitter measurement is determined, the voltage or frequency of the operating clock signal may be adjusted as described. In a particular embodiment, the frequency of the operating clock may be reduced when the clock jitter exceeds a pre-determined threshold value. In addition, the voltage of the operating clock may be increased when the clock jitter exceeds the pre-determined threshold. Thus, the frequency and voltage of the operating clock may be adjusted based on the measured clock jitter of the operating clock signal.

In addition, the disclosed system and method provide a means for determining a shortest clock period when a selected point from a delay chain indicates an edge of the clock signal and for determining a jitter value based on a difference between the shortest clock period and a nominal clock period. In addition, the disclosed system provides means for controlling the frequency, the voltage, or any combination thereof of an operating clock based on the measured jitter value. An example of the means for adjusting the selected point is a logic circuit, such as the logic circuit 310 illustrated in FIG. 3.

In a particular illustrative embodiment, a clock jitter test circuit, such as the circuits 200 and 304 illustrated in FIGS. 2 and 3, may be utilized during a manufacturing process to sort circuit devices into different bins based on a tested performance. For example, circuit devices that indicate a high incidence of jitter based on a difference between a detected clock period with jitter and a nominal clock period that exceeds a threshold difference may be sorted for use in lower performance circuit devices. Alternatively, such devices may be reworked or destroyed, depending on the circuit.

Additionally, while the hierarchical multiplexer circuit of FIG. 2 illustrates only two levels of hierarchical multiplexer components, one or more multiplexer tiers may be used. In a particular illustrative embodiment, multiple multiplexer tiers are used. Additionally, the number of first tier multiplexer devices may vary depending on the number of sampling points and the degree of accuracy. Additionally, other delay elements may be used that have longer or shorter delay periods, depending of the required degree of accuracy and the cost (both in terms of financial costs and circuit area usage costs). Additionally, embodiments of the clock jitter determination circuit can be used to determine a clock jitter value to a high degree of accuracy, by adjusting a variable clock delay element, such as the variable clock delay 204 in FIG. 2, until the transition point of the clock edge is detected to a desired degree of accuracy. By determining the clock jitter to such a level of accuracy, circuit designers can provide for a smaller clock jitter margin to enhance operating clock speeds for circuit devices.

Additionally, since the clock jitter detection circuit uses multiplexers to selectively sample the delay chain, the detection circuit can occupy a relatively small area of the overall circuit without reducing the number of potential sampling points. While conventional jitter detection circuits include separate latch circuits for each sampling point, the multiplexers allow measurements from selected sampling points to be latched rather than latching measurements for each sampling point, thereby reducing the number of latch circuits used to measure clock jitter and reducing the circuit area used to take such measurements. Further, the clock jitter determination circuit can be used to adjust a voltage or frequency an operating clock for the circuit or for another circuit to enhance performance and conserve clock power based on the clock jitter determination.

In conjunction with the circuit devices, methods and systems described, a clock jitter measurement circuit may be utilized to measure a clock period associated with a received clock signal based on the detection of a desired value at a particular sampling point. A difference between an expected nominal clock signal and a received clock signal may be determined based on the detection. In a particular illustrative embodiment, the difference may represent a jitter value of the clock signal, which may be used to adjust power to a clock generator circuit, to adjust power to other circuit elements, to alter a frequency of the clock signal, or any combination thereof. It should be understood that the desired portion of the clock signal may be a rising edge or a falling edge of the clock signal. In a particular illustrative embodiment, the desired portion of the clock signal may be level portion of the clock signal. In a particular illustrative embodiment, clock jitter may be determined from early clock edges, late clock edges, or any combination thereof.

Additionally, while many of the examples described the measurements in terms of time, the term "time", as used herein, is a relative unit of measurement. In a particular embodiment, time may be represented in terms of absolute time (e.g., seconds, microseconds, nanoseconds, picoseconds, etc.). In another particular illustrative embodiment, time may be represented in terms of relative units of circuit delay. In still another particular illustrative embodiment, time may be indicated using another unit of measure. In yet another particular illustrative embodiment, time may be a calculated value that is based on one or more of the absolute time, the relative time, and another unit of measure.

Figure 8:
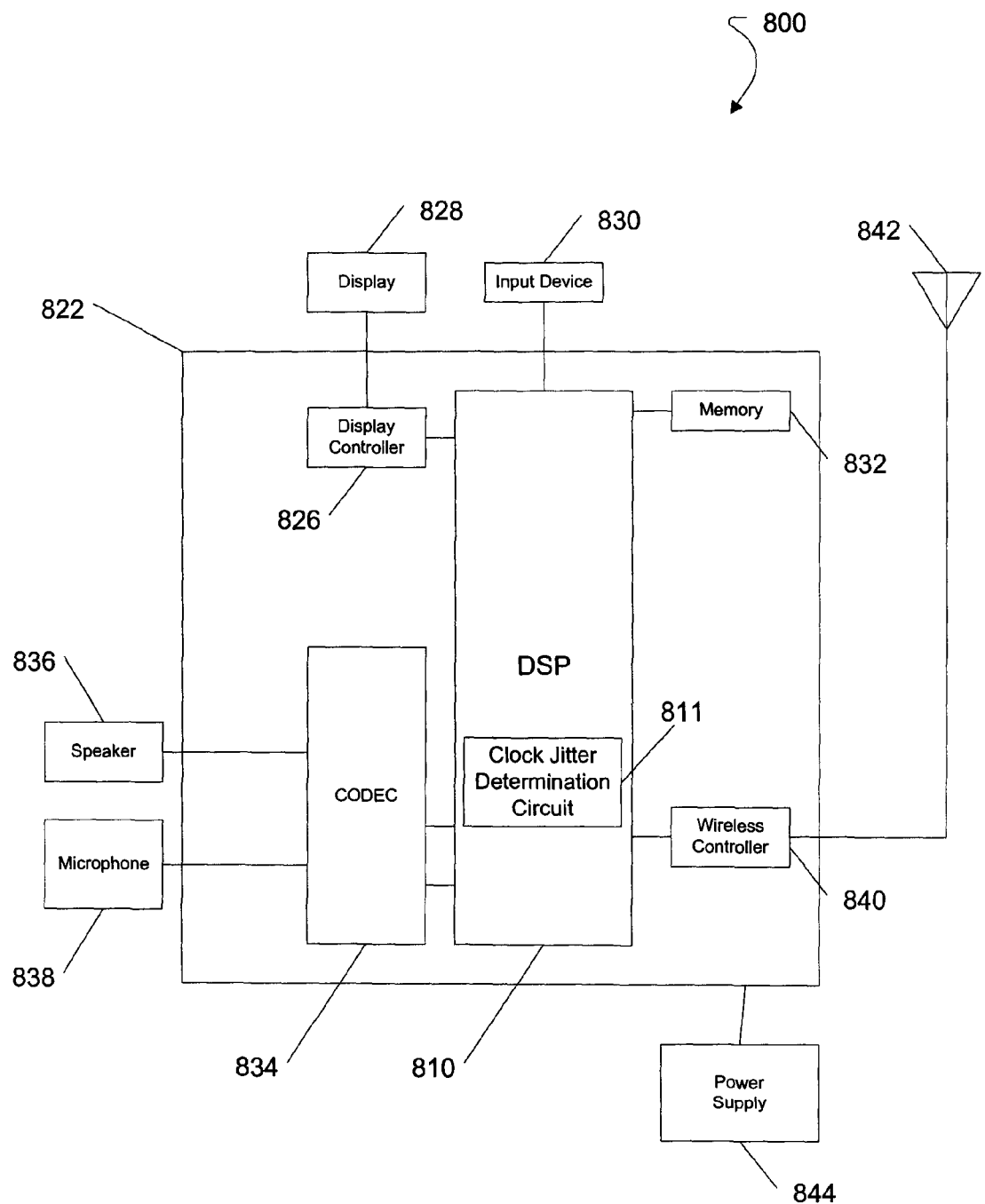
FIG. 8 is a block diagram of a particular illustrative embodiment of a portable communications device including a circuit to measure clock jitter.

FIG. 8 illustrates an exemplary, non-limiting embodiment of a portable communication device that is generally designated 800. The portable communications device 800 includes an on-chip system 822 that includes a processor, such as a digital signal processor 810 having a clock jitter determination circuit 811 (as described with respect to FIGS. 2-3 and 6-7). FIG. 8 also shows a display controller 826 that may be coupled to the digital signal processor 810 and to a display 828. Moreover, an input device 830 is coupled to the digital signal processor 810. Additionally, a memory 832 is coupled to the digital signal processor 810. A coder/decoder (CODEC) 834 can also be coupled to the digital signal processor 810. A speaker 836 and a microphone 838 can be coupled to the CODEC 834.

FIG. 8 also indicates that a wireless controller 840 can be coupled to the digital signal processor 810 and to a wireless antenna 842. In a particular embodiment, a power supply 844 is coupled to the on-chip system 822. Moreover, in a particular embodiment, as illustrated in FIG. 8, the display 828, the input device 830, the speaker 836, the microphone 838, the wireless antenna 842, and the power supply 844 are external to the on-chip system 822. However, each is coupled to a component of the on-chip system 822.

In a particular illustrative embodiment, the clock jitter determination circuit 811 may be used to monitor clock jitter of an operating clock and may be used to dynamically adjust clock power, circuit power consumption, or a frequency of an operating clock based on the detected jitter. The clock jitter determination circuit 811 may be used to enhance overall performance of the portable communications device 800. In particular, the clock jitter determination circuit 811 may produce jitter information that can be used by control circuitry, such as the clock control circuitry (such as the clock control circuit 312 illustrated in FIG. 3), or by control logic within the DSP 810, to increase the processor speed (i.e., reducing clock jitter margin of error overhead to allow for enhanced performance), to adjust an operating clock (i.e., slowing the operating clock slightly to reduce jitter, for example), to adjust power consumption, or any combination thereof.

It should be understood that while the clock jitter determination circuit 811 is shown within the digital signal processor 810, the clock jitter determination circuit 811 may be provided in other components, including the display controller 826, the wireless controller 840, the CODEC 834, or any other component that performs operations that may be effected by clock jitter.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in RAM memory, flash memory, ROM memory, PROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope possible consistent with the principles and novel features as defined by the following claims.

What is claimed is:

1. A method comprising:
    receiving a clock signal at a delay chain of a circuit device;
    latching a sampled value at a selected point of the delay chain, wherein the latched sampled value corresponds to a value of the clock signal along the delay chain; and
    adjusting the selected point when the latched sampled value does not indicate detection of a desired portion of the clock signal; and
    applying a variable delay to the clock signal at a clock delay element coupled to an input of the delay chain.

2. The method of claim 1, wherein the desired portion comprises one of a rising edge, a falling edge, and a level portion of the clock signal.

3. The method of claim 1, further comprising determining a clock period when the latched sampled value indicates detection of the desired portion of the clock signal.

4. The method of claim 3, further comprising:
    determining an error margin associated with the detection of the desired portion of the clock signal; and
    shifting a time at which the clock signal is received at the delay chain by a known time increment when the error margin is greater than an error threshold.

5. The method of claim 4, wherein the delay chain comprises a plurality of delay elements, wherein each delay element introduces a delay time, and wherein the known time increment comprises a fraction of the delay time.

6. The method of claim 3, further comprising determining a jitter value based on a difference between the determined clock period and a nominal clock period.

7. The method of claim 3, further comprising controlling a frequency of an operating clock based on the clock period.

8. The method of claim 3, further comprising controlling a voltage of an operating clock based on the clock period.

9. The method of claim 1, wherein the selected point initially comprises an initial point in the delay chain that is greater than a nominal period of a clock that provides the clock signal, and wherein adjusting comprises decrementing the selected point in the delay chain to identify a second point that is earlier in the delay chain than the initial point.

10. The method of claim 1, further comprising:
    providing a second sampled value of the clock signal at a second point; and
    adjusting the second point when the second sampled value does not indicate detection of the edge of the clock signal.

11. The method of claim 1, wherein the selected point initially comprises a point in the delay chain that is less than an expected period of a clock that provides the clock signal, and wherein adjusting comprises incrementing the selected point in the delay chain by selecting a different sampling point in the delay chain that is later in the delay chain than the initial point.

12. The method of claim 1, wherein the selected point comprises a point within the delay chain that is related to an expected distance traveled by the clock signal along the delay chain based on a nominal clock frequency.

13. The method of claim 1, further comprising:
    latching multiple sampled values at multiple selected points of the delay chain, wherein each latched sampled value corresponds to a value of the clock signal along the delay chain.

14. A circuit device, comprising:
    a delay chain comprising a plurality of delay elements, the delay chain responsive to a clock signal;
    a hierarchical multiplexer circuit including:
        a first tier multiplexer circuit configured to receive a value of the clock signal at a selected point between the delay elements and to provide a sampled value of the clock signal;
        a latch circuit configured to receive the sampled value of the clock signal and to provide a latched sampled value of the clock signal;
    a logic circuit coupled to the hierarchical multiplexer circuit and configured to control the hierarchical multiplexer circuit to adjust the selected point when the latched sampled value does not indicate an edge of the clock signal; and
    a clock delay element coupled to an input of the delay chain to apply a variable delay to the clock signal.

15. The circuit device of claim 14, wherein the hierarchical multiplexer circuit comprises a plurality of multiplexers, wherein each of the plurality of multiplexers includes multiple inputs coupled to different points in the delay chain.

16. The circuit device of claim 15, wherein each of the plurality of multiplexers includes an equal number of inputs.

17. The circuit device of claim 15, wherein the hierarchical multiplexer circuit further comprises at least one second multiplexer including multiple inputs responsive to a respective output of each of the plurality of multiplexers.

18. The circuit device of claim 14, wherein the hierarchical multiplexer circuit includes a second tier multiplexer circuit configured to receive the latched sampled value of the clock signal.

19. The circuit device of claim 14, wherein the hierarchical multiplexer circuit comprises:
   a first plurality of multiplexers, each multiplexer of the first plurality of multiplexers including an equal number of inputs coupled to different points within the delay chain, each multiplexer of the first plurality of multiplexers including a selection input; and
   at least one second multiplexer including a second plurality of inputs coupled to respective outputs of the first plurality of multiplexers, the at least one second multiplexer including a selection input responsive to the logic circuit and having an output to provide the latched sample value related to the selected point of the delay chain to the logic circuit.

20. The circuit device of claim 14, further comprising a clock delay element coupled to an input of the delay chain to shift the clock signal by a known time increment to alter a time at which the clock signal is received at the delay chain.

21. The circuit device of claim 14, wherein the logic circuit determines a clock period when the selected point indicates an edge of the clock signal.

22. The circuit device of claim 21, wherein the logic circuit adjusts a frequency of an operating clock based on a difference between a nominal clock period and the determined clock period.

23. The circuit device of claim 21, wherein the logic circuit adjusts a voltage of an operating clock based on a difference between a nominal clock period and the determined clock period.

24. A method comprising:
   receiving a clock signal at a delay chain of a circuit device;
   determining a location of an edge of the clock signal within the delay chain to determine a detected clock period of the clock signal, wherein locating the edge of the clock signal comprises:
      latching a sampled value of the clock signal at a selected point of the delay chain, wherein the latched sampled value corresponds to a value of the clock signal along the delay chain;
      iteratively determining the value of the clock signal at the selected point within the delay chain;
      adjusting the selected point until the value indicates an edge of the clock signal;
      applying a variable delay to the clock signal at a clock delay element coupled to an input of the delay chain; and
   comparing the location of the edge of the clock signal with a location of an edge of a nominal clock signal to determine a clock jitter measurement.

25. The method of claim 24, wherein the selected point comprises a point within the delay chain related to a nominal clock period.

26. The method of claim 24, further comprising controlling a frequency of an operating clock based on the clock jitter measurement.

27. The method of claim 26, further comprising reducing a frequency of the operating clock when the clock jitter measurement exceeds a predetermined threshold.

28. The method of claim 24, further comprising controlling a voltage of an operating clock based on the clock jitter measurement.

29. The method of claim 28, wherein controlling the voltage comprises reducing a voltage level of the operating clock when the clock jitter measurement exceeds a threshold.

30. A processor device, comprising:
   means for receiving a clock signal at a delay chain of a circuit device;
   means for latching a sampled value at a selected point of the delay chain, wherein the latched sampled value corresponds to a value of the clock signal along the delay chain; and
   means for adjusting the selected point when the latched sampled value does not indicate an edge of the clock signal; and
   means for applying a variable delay to the clock signal at a clock delay element coupled to an input of the delay chain.

31. The device of claim 30, further comprising means for determining a shortest clock period when the latched sampled value indicates an edge of the clock signal and for determining a jitter value based on a difference between the shortest clock period and a nominal clock period.

32. The device of claim 31, further comprising means for controlling a frequency of an operating clock based on the jitter value.

33. The device of claim 31, further comprising means for controlling a voltage of an operating clock based on the jitter value.

34. The device of claim 30, wherein the means for adjusting the selected point comprises a logic circuit.

* * * * *